(12) United States Patent
Kim et al.

(10) Patent No.: US 8,908,461 B2
(45) Date of Patent: Dec. 9, 2014

(54) REFRESH CIRCUIT IN SEMICONDUCTOR MEMORY DEVICE

(71) Applicant: Samsung Electronics Co., Ltd., Gyeonggi-do (KR)

(72) Inventors: Young-Hun Kim, Gyeonggi-do (KR); Inchul Jeong, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 5 days.

(21) Appl. No.: 13/770,538

(22) Filed: Feb. 19, 2013

(65) Prior Publication Data
US 2013/0272082 A1 Oct. 17, 2013

(30) Foreign Application Priority Data

Apr. 17, 2012 (KR) .................. 10-2012-0039810

(51) Int. Cl.
| | | |
|---|---|---|
| G11C 7/00 | (2006.01) | |
| G11C 7/12 | (2006.01) | |
| G11C 11/406 | (2006.01) | |
| G11C 11/402 | (2006.01) | |

(52) U.S. Cl.
CPC ............. *G11C 11/402* (2013.01); *G11C 7/12* (2013.01); *G11C 11/40615* (2013.01); *G11C 11/40618* (2013.01)
USPC .................... 365/222; 365/203; 365/230.06

(58) Field of Classification Search
CPC .......... G11C 11/406; G11C 11/40611; G11C 11/40618; G11C 11/40626; G11C 2211/4065; G11C 7/04
USPC ........ 365/222, 230.03, 230.06, 236, 194, 203
See application file for complete search history.

(56) References Cited

U.S. PATENT DOCUMENTS

| | | | | |
|---|---|---|---|---|
| 7,145,825 B2 * | 12/2006 | Mori et al. | .................... | 365/222 |
| 7,286,434 B2 * | 10/2007 | Mori et al. | .................... | 365/222 |
| 7,359,269 B2 | 4/2008 | You | | |
| 7,768,860 B2 | 8/2010 | You | | |
| 7,881,140 B2 | 2/2011 | Yang | | |
| 8,004,921 B2 * | 8/2011 | Kawakubo et al. | ........... | 365/222 |
| 8,077,537 B2 * | 12/2011 | Kawakubo et al. | ........... | 365/222 |
| 2007/0121410 A1 * | 5/2007 | Mori | ............................. | 365/222 |
| 2009/0279373 A1 | 11/2009 | Han | | |
| 2010/0182862 A1 * | 7/2010 | Teramoto | ...................... | 365/222 |

FOREIGN PATENT DOCUMENTS

| | | |
|---|---|---|
| JP | 04-364295 | 12/1992 |
| JP | 2011-035152 | 2/2001 |
| KR | 1019990042331 | 6/1999 |
| KR | 1020020074332 | 9/2002 |
| KR | 1020040034830 | 4/2004 |
| KR | 1020040093895 | 11/2004 |

* cited by examiner

*Primary Examiner* — Gene Auduong
(74) *Attorney, Agent, or Firm* — F. Chau & Associates, LLC

(57) ABSTRACT

A refresh circuit in a semiconductor memory device performs a multi-enable skew refresh operation during each periodic refresh operation. The refresh circuit includes a signal generation unit configured to generate a plurality of refresh signals having different timings during a refresh operation period, a first refresh circuit configured to enable refresh target lines associated with a first memory group in a memory cell array through operation periods of at least two time periods by using some of the refresh signals, and a second refresh circuit configured to enable refresh target lines associated with a second memory group differing from the first memory group through operation periods of at least two time periods by using some or all of the rest of the refresh signals. Enable timings of the first and second refresh circuits do not coincide each other.

20 Claims, 7 Drawing Sheets

Fig. 6
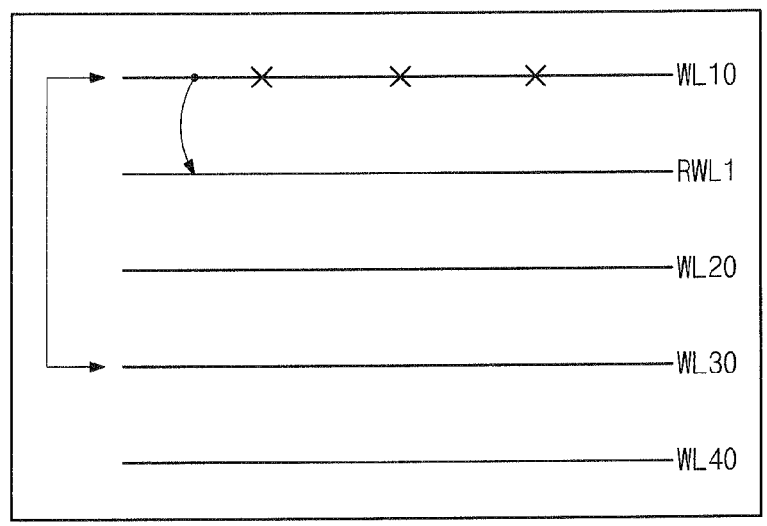
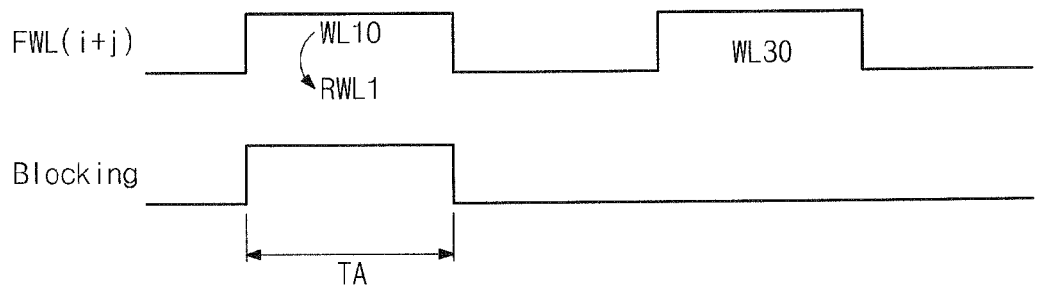

REFRESH CIRCUIT IN SEMICONDUCTOR MEMORY DEVICE

CROSS-REFERENCE TO RELATED APPLICATIONS

This US non-provisional patent application claims priority under 35 USC §119 to Korean Patent Application No. 10-2012-0039810, filed on Apr. 17, 2012, the entirety of which is hereby incorporated by reference.

BACKGROUND OF THE INVENTIVE CONCEPT

1. Technical Field

The present general inventive concept relates to semiconductor memory devices such as dynamic random access memories (DRAMs) and, more particularly, to a refresh circuit in a semiconductor memory device which is capable of minimizing and reducing peak current during a refresh operation.

2. Discussion of the Related Art

Semiconductor memory devices such as DRAMs are widely used as main memories in electronic devices such as computers. Semiconductor memory devices are made of a semiconductor material such as silicon (Si), germanium (Ge), gallium arsenide (GaAs), indium phosphide (InP). Semiconductor memory devices are classified into volatile memory devices and nonvolatile memory devices.

DRAMs are volatile semiconductor memories which lose their stored data when their power supplies are interrupted. Dynamic random-access memory (DRAM) is a type of random-access memory that stores each bit of data in a separate capacitor within an integrated circuit. The capacitor can be either charged or discharged; these two states are taken to represent the two logic values of a bit, conventionally called "0" and "1". Since capacitors leak charge, DRAMs require a periodic refresh operation for reading data already stored in a memory cell and then restoring (re-writing) the read data to the same memory cell.

While being similar to a data read operation, a refresh operation of a DRAM is different from the data read operation in that data is generally not output to an external host processor (e.g., a CPU).

Typically, designer specify that each row must have its storage cell capacitors refreshed every 64 ms or less, as defined by the JEDEC (Foundation for developing Semiconductor Standards) standard. Refresh logic is provided in a DRAM controller which automates the periodic refresh. In general, a refresh operation of a DRAM is performed by applying a row address strobe (RASB) signal to the DRAM after a high-to-low transition of the RASB signal, activating a wordline corresponding to a row address to be refreshed, and driving a bitline sense amplifier for sensing the existing (already stored) data in the memory cell.

Typically, manufacturers specify that each row must have its storage cell capacitors refreshed every 64 ms or less, as defined by the JEDEC (Foundation for developing Semiconductor Standards) standard. Refresh logic is provided in a DRAM controller which automates the periodic refresh, that is no software or other hardware has to perform it. This makes the controller's logic circuit more complicated, but this drawback is outweighed by the fact that DRAM is much cheaper per storage cell and because each storage cell is very simple, DRAM has much greater capacity per geographic area than SRAM.

Some systems refresh every row in a burst of activity involving all rows every 64 ms. Thus, the self-refresh operation period is 64 ms. Other systems refresh one row at a time throughout the 64 ms interval. For example, a system with 8192 rows would require a refresh rate of one row every 7.8 µs which is 64 ms divided by 8192 rows. A few real-time systems refresh a portion of memory at a time determined by an external timer function that governs the operation of the rest of a system, such as the vertical blanking interval that occurs every 10-20 ms in video equipment. All methods require some sort of counter to keep track of which row is the next to be refreshed.

A conventional refresh standard of a DRAM is 16 ms/1024 (cycle) in 4 megabytes. Thus, it has been recommended to maintain a refresh interval of 15.6 microseconds. Since the refresh time should be the same despite any increase in memory density of a DRAM, various methods have been studied to decrease the number of refresh cycles. These method are not to execute refresh cycles of the same number as rows (as in less dense DRAMS) but to increase the number of rows activated during a refresh operation. For example, if row activation is conducted by one-eighth (of rows) when a semiconductor memory device performs a normal operation, row activation is conducted by a quarter or half (of rows) in case of a refresh operation. Thus, the number of rows activated during the refresh operation increases two or four times as large as in case of the normal operation and thus the number of refresh cycles decreases.

However, an increase of row activation during the refresh operation causes the disadvantage that since the number of concurrently operating memory portions increases, a noise peak value increases.

And, if the number of rows activated at a time increases so as to decrease the number of refresh cycles during a refresh operation of a DRAM, it is difficult to minimize or reduce peak current.

SUMMARY OF THE INVENTION

Exemplary embodiments of the inventive concept provide a refresh circuit in a semiconductor memory device that performs a multi-enable skew refresh operation during each periodic refresh operation.

According to an aspect of the inventive concept, a refresh circuit in a semiconductor memory device including a memory cell array may include a signal generation unit configured to generate a plurality of refresh signals having different timings during a refresh operation period; a first refresh circuit configured to enable refresh target lines associated with a first memory group in the memory cell array through operation periods of at least two time periods by using some of the refresh signals; and a second refresh circuit configured to enable refresh target lines associated with a second memory group in the memory cell array and differing from the first memory group through operation periods of at least two time periods by using some or all of the rest of the refresh signals. Enable timings of the first and second refresh circuits do not coincide each other.

In an exemplary embodiment, the first and second memory groups are memory bank units.

In an exemplary embodiment, the first and second memory groups are memory block units.

In an exemplary embodiment, the refresh target lines are wordlines having different row addresses.

In an exemplary embodiment, a disable period for guaranteeing bitline precharge time may exist between the operation periods of two time periods.

In an exemplary embodiment, the signal generation unit may include a command decoder configured to decode externally applied memory command signals to generate a refresh command signal; and a refresh signal generator configured to generate first group refresh signals and second group refresh signals as the plurality of refresh signals by sequentially delaying the refresh command signal.

In an exemplary embodiment, the first refresh circuit may include a first group row enable generator configured to generate a first group row enable signal by logically gating the first group refresh signals of the refresh signal generator; a refresh counter configured to perform counting in response to a transition of the first group row enable signal to output an internal refresh address; a multiplexer configured to output either one of the internal refresh address and an external refresh address according to the state of the first group row enable signal; and a first wordline driving signal generator configured to generate first wordline driving signals for enabling refresh target lines associated with the first memory group in the memory cell array through operation period of at least two time periods when the internal refresh address is output from the multiplexer.

In an exemplary embodiment, the second refresh circuit may include a second group row enable generator configured to generate a second group row enable signal by logically gating the second group refresh signals of the refresh signal generator; and a second wordline driving signal generator configured to generate second wordline driving signals for enabling refresh target lines associated with a second memory group in the memory cell array through operation periods of at least two time periods when the internal refresh address is output from the multiplexer.

According to another aspect of the inventive concept, a refresh circuit in a semiconductor memory device may include a signal generation unit configured to generate a plurality of refresh signals having different timings during a refresh operation period; a first refresh circuit configured to enable different wordlines associated with a first memory block of a first memory bank in a memory cell array through operation periods of at least two time periods by using some of the refresh signals; and a second refresh circuit configured to enable different wordlines associated with a second memory block of the first memory bank through operation period of at least two time periods by using some or all of the rest of the refresh signals Enabling timings of the first and second refresh circuits have a skew with respect to each other.

In an exemplary embodiment, a memory cell array of the semiconductor memory device includes four or more memory banks.

In an exemplary embodiment, the different wordlines associated with the first memory block are enabled two or more times during each refresh operation period.

In an exemplary embodiment, a disable period for guaranteeing bitline precharge time may exist between the operation periods of two time periods.

In an exemplary embodiment, the signal generator may include a command decoder configured to decode externally applied memory command signals to generate a refresh command signal; and a refresh signal generator configured to generate first group refresh signals and second group refresh signals having different timings as the plurality of refresh signals by dependently delaying the refresh command signals.

In an exemplary embodiment, the first refresh circuit may include a first group row enable generator configured to generate a first group row enable signal by logically gating the first group refresh signals of the refresh signal generator; a refresh counter configured to perform counting in response to a transition of the first group row enable signal to output an internal refresh address; a multiplexer configured to output either one of the internal refresh address and an external refresh address according to a state of the first group row enable signal; and a first wordline driving signal generator configured to generate first wordline driving signals for enabling wordlines associated with the first memory block through operation period of at least two time periods when the internal refresh address is output from the multiplexer.

In an exemplary embodiment, the second refresh circuit may include a second group row enable generator configured to generate a second group row enable signal by logically gating the second group refresh signals of the refresh signal generator; and a second wordline driving signal generator configured to generate second wordline driving signals for enabling wordlines associated with the second memory block through operation periods of at least two time periods when the internal refresh address is output from the multiplexer.

The features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose examples of the inventive concept and to let those skilled in the art understand the nature of the inventive concept.

In the specification, it will also be understood that when an element or lines are referred to as being "connected" to a target element block, it can be directly connected to the target element block, or intervening another element may also be present.

The terms used in the specification are for the purpose of describing particular exemplary embodiments only and are not intended to be limiting of the invention. As used in the specification, the singular forms "a", "an" and "the" are intended to include the plural forms as well, unless the context clearly indicates otherwise.

Each embodiment described and exemplified herein may include a complementary embodiment thereof.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures:

FIG. 6 is a timing diagram that schematizes enabling of a normal wordline and a redundancy wordline repaired according to a refresh operation of the refresh circuit of FIG. 1;

DETAILED DESCRIPTION OF EXEMPLARY EMBODIMENTS

Figure 1:
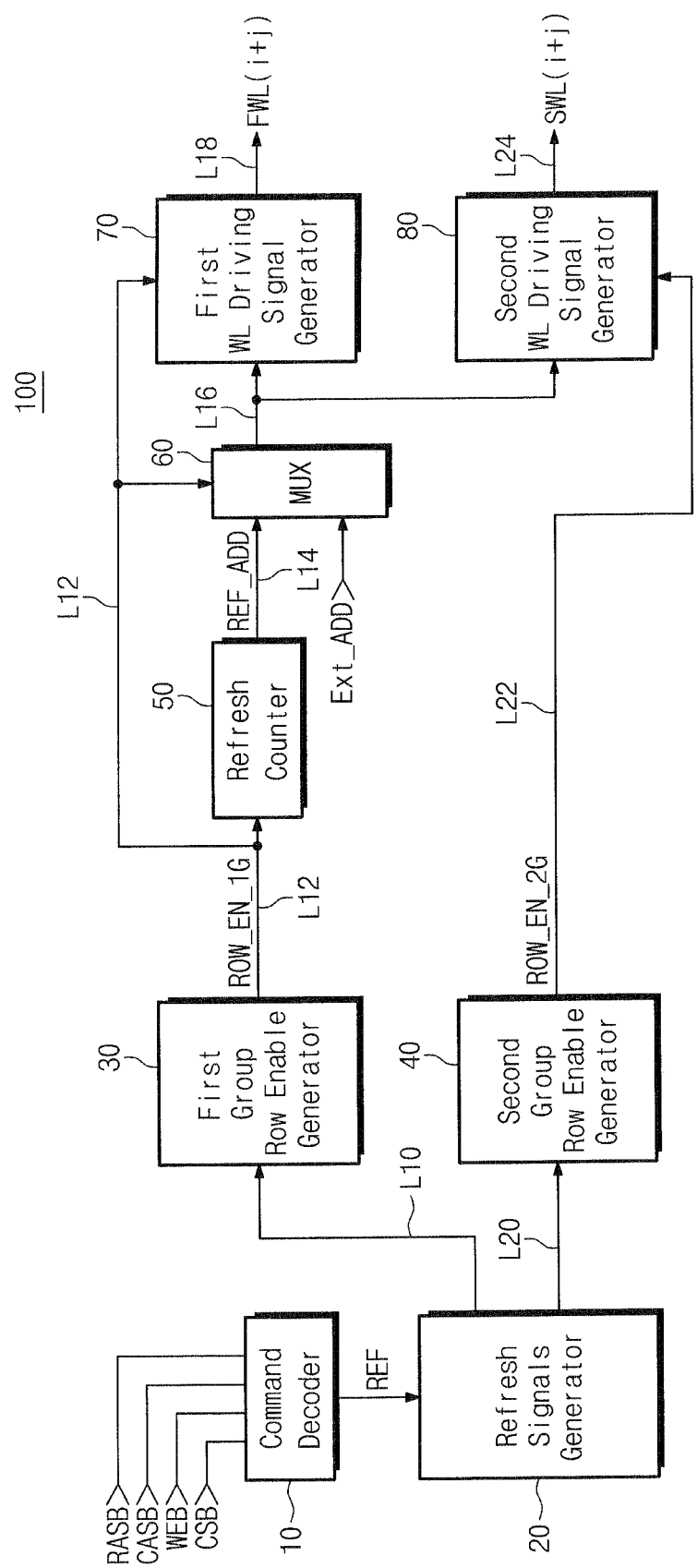
FIG. 1 is a block diagram of a refresh circuit according to an embodiment of the inventive concept.

FIG. 1 is a block diagram of a refresh circuit 100 according to an exemplary embodiment of the inventive concept. The refresh circuit 100 includes a command decoder 10, a refresh signal generator 20, a first group row enable generator 30, a second group row enable generator 40, a refresh counter 50, a multiplexer 60, a first wordline driving signal generator 70, and a second wordline driving signal generator 80.

The command decoder 10 and the refresh signal generator 20 constitute a signal generation unit that generates a plurality of refresh signals having different timings during a refresh operation period.

The first group row enable generator 30, the refresh counter 50, the multiplexer 60, and the first wordline driving signal generator 70 constitute a first refresh circuit that enables refresh target lines associated with a first memory group in a memory cell array through operation periods of at least two time periods by using some of the refresh signals output from the refresh signal generator 20.

The second group row enable generator 40 and the second wordline driving signal generator 80 constitute a second refresh circuit that enables refresh target lines associated with a second memory group, which is different from the first memory group, through operation periods of at least two time periods by using all or some of the rest of the refresh signals output from the refresh signal generator 20.

Enable timings of the first and second refresh circuits do not match each other, i.e., have a time skew.

The command decoder 10 of the signal generation unit decodes externally applied memory command signals RASB, CASB, WEB, and CSB to generate a refresh command signal REF.

The refresh signal generator 20 of the signal generation unit generates first group refresh signals on lines L10 and second group refresh signals on lines L20 as the refresh signals by differently delaying the refresh command signal REF. The first group refresh signals are output through the line L10, and the second group refresh signals are output through the line L20.

The first group row enable generator 30 of the first refresh circuit generates a first group row enable signal ROW_EN_1G by logically gating the first group refresh signals of the refresh signal generator 20.

The refresh counter 50 of the first refresh circuit performs counting in response to a transition of the first group row enable signal ROW_EN_1G to output an internal refresh address REF_ADD.

The multiplexer 60 of the first refresh circuit outputs one of the internal refresh address REF_ADD and an external refresh address EXT_ADD according to the (binary) state of the first group row enable signal ROW_EN_1G. Thus, the multiplexer 60 outputs the internal refresh address REF_ADD to line L16 when the first group row enable signal ROW_EN_1G is enabled.

The first wordline driving signal generator 70 of the first refresh circuit generates first wordline driving signals FWL (i+j) for enabling refresh target lines (wordlines) associated with the first memory group in the memory cell array through operation periods of at least two time periods when the internal refresh address REF_ADD is output from the multiplexer 60.

The second group enable generator 40 of the second refresh circuit generates a second group row enable signal ROW_EN_2G by logically gating the second group refresh signals of the refresh signal generator 20.

The second wordline driving signal generator 80 of the second refresh circuit generates second wordline driving signals SWL(i+j) for enabling refresh target lines associated with the second memory group in the memory cell array through operation periods of at least two time periods when the internal refresh address REF_ADD is output from the multiplexer 60.

The first and second memory groups may be a memory bank units or memory block units. The refresh target lines may be wordlines having different row addresses. A disable period for guaranteeing bitline precharge time may exist between the operation periods of at least two time periods.

Figure 2:
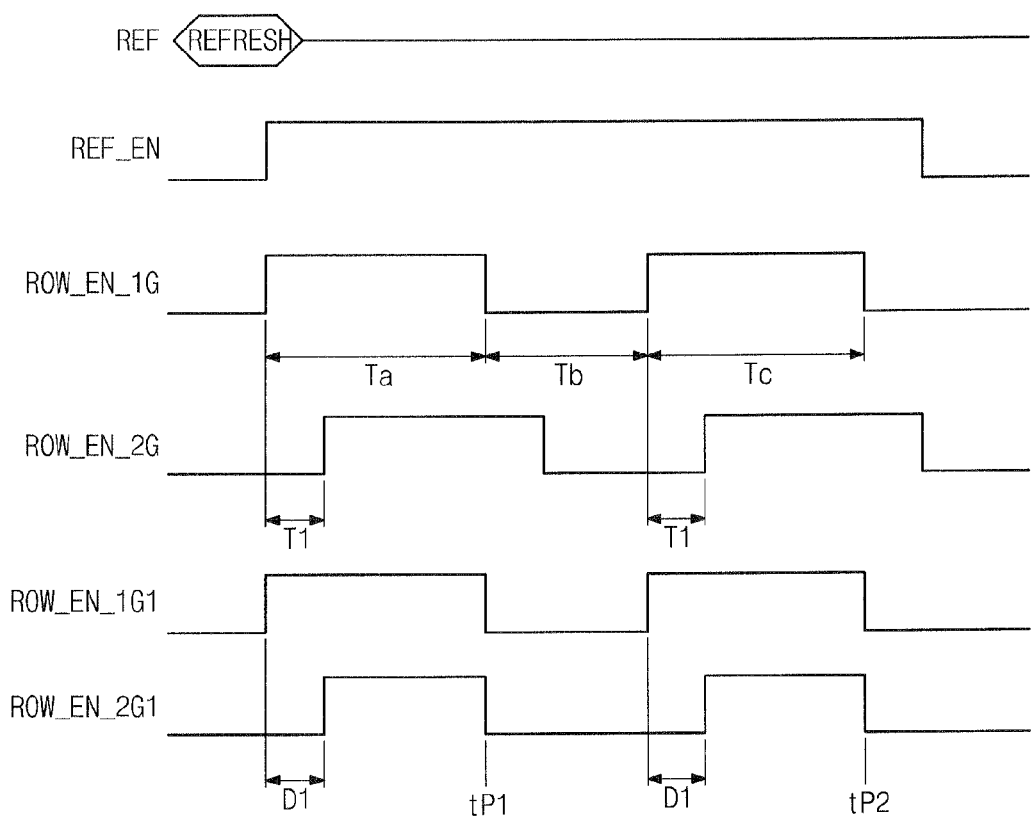
FIG. 2 is a timing diagram associated with a refresh operation of the refresh circuit of FIG. 1.

FIG. 2 is a timing diagram associated with a refresh operation of the refresh circuit of FIG. 1.

When a refresh command signal REF is applied, a refresh signal generator 20 generates a refresh enable signal REF_EN as a master signal of a refresh operation according to an exemplary embodiment of the inventive concept.

In case of a typical refresh operation, (i.e., when the refresh enable signal REF_EN is high), wordlines of a corresponding memory bank are activated and bitlines are sensed. On the other hand, when the refresh enable signal REF_EN is low, wordlines of a corresponding memory bank are disabled and bitlines are precharged.

In this embodiment of the inventive concept, wordlines are activated by using refresh enable signal REF_EN as a master signal of the refresh operation and by generating therefrom the first and second group row enable signals ROW_EN_1G and ROW_EN_2G.

Thus, the first group row enable generator 30 of the first refresh circuit in FIG. 1 generates a first group row enable signal ROW_EN_1G by logically gating the first group refresh signals applied from the refresh signal generator 20. the waveform of the first group row enable signal ROW_EN_1G may be the waveform ROW_EN_1G shown in FIG. 2.

The second group row enable generator 40 of the second refresh circuit in FIG. 1 generates a second group row enable signal ROW_EN_2G by logically gating the second group refresh signals applied from the refresh signal generator 20. The waveform of the second group row enable signal ROW_EN_2G may be the waveform ROW_EN_2G shown in FIG. 2.

In FIG. 2, it will be shown that the waveform of the second group row enable signal ROW_EN_2G is delayed by the time period T1 from the waveform of the first group row enable signal ROW_EN_1G. Thus, the second group row enable signal ROW_EN_2G and the first group row enable signal ROW_EN_1G are generated with a time skew of the time period T1.

During a high-level period of the refresh enable signal REF_EN, the first group row enable signal ROW_EN_1G has two high-level periods Ta and Tc and one low-level period Tb. A plurality of wordlines are activated during the high-level periods Ta and Tc, and read cell data is restored to a corresponding memory cell during the low-level period Tb. A plurality of wordlines may be activated during the high-level period Ta.

Similar to the first group row enable signal ROW_EN_1G, the second group row enable signal ROW_EN_2G has two high-level periods and one low-level period.

As set forth above, generation of the first and second group row enable signals ROW_EN_1G and ROW_ENG_2G results in generation of first wordline driving signals FWL(i+j) for enabling refresh target wordlines associated with a first memory group in a memory cell array through operation periods of at least two time periods and second wordline driving signals SWL(i+j) for enabling refresh target wordlines associated with a second memory group in the memory cell array through operation periods of at least two time periods.

Accordingly, refresh is not conducted on each memory bank or memory block but may be conducted with a time difference (T1 or D1) which may be a design constant. In addition, a plurality of wordlines are activated after they are assigned to the operation periods of two time periods in the same memory bank or same memory block. Thus, the peak current during the refresh operation is minimized or reduced.

As a modified example related with the generation of the first and second group row enable signals ROW_EN_1G and ROW_EN_2G, waveforms of modified first and second group row enable signals ROW_EN_1G1 and ROW_EN_2G1 are shown in FIG. 2.

Thus, an enable timing of the modified second group row enable signal ROW_EN_2G1 is delayed by time period D1 from the modified first group row enable signal ROW_EN_1G1. However, their disable timings may match each other, as shown at time points tp1 and tp2.

Figure 3:
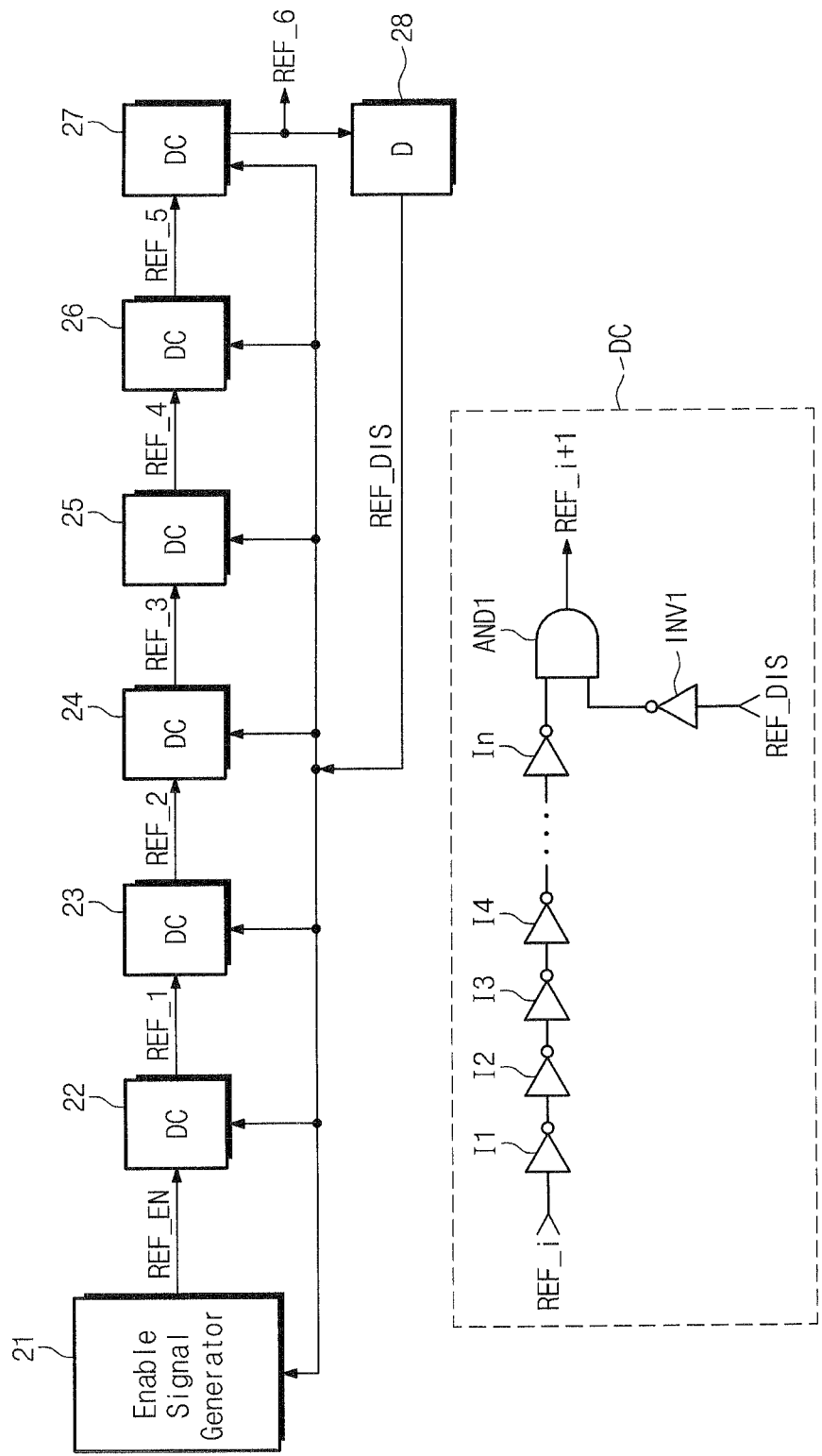
FIG. 3 is a detailed circuit diagram of the refresh signal generator shown in the refresh circuit of FIG. 1.

FIG. 3 is a detailed circuit diagram of the refresh signal generator 20 shown in the refresh circuit of FIG. 1. The refresh signal generator 20 includes an enable signal generator 21, a plurality of d cascade-connected delay circuits 22 through 27, and a delay unit 28.

The enable signal generator 21 generates a refresh enable signal REF_EN by receiving a refresh command signal REF applied from the command decoder 10 in FIG. 1. The waveform of the refresh enable signal REF_EN may be the waveform REF_EN in FIG. 5.

The first delay circuit 22 delays AND-gates the refresh enable signal REF_EN to generate a first refresh delay signal REF_1.

The second delay circuit 23 delays AND-gates the first refresh delay signal REF_1 to generate a second refresh delay signal REF_2.

The third delay circuit 24 delays AND-gates the second refresh delay signal REF_2 to generate a third refresh delay signal REF_3.

The fourth delay circuit 25 delays AND-gates the third refresh delay signal REF_3 to generate a forth refresh delay signal REF_4.

The fifth delay circuit 26 delays AND-gates the fourth refresh delay signal REF_4 to generate a fifth refresh delay signal REF_5.

The last of the d cascade-connected delay circuits delays AND-gates the prior refresh delay signal to generate a d-th refresh delay signal. In the example shown in FIG. 3, the number d is six and the sixth delay circuit 27 delays AND-gates the fifth refresh delay signal REF_5 to generate a sixth refresh delay signal REF_6.

The delay unit 28 delays the sixth refresh delay signal REF_6 to generate a refresh disable signal REF_DIS.

The refresh disable signal REF_DIS is applied (fed back) to the enable signal generator 21 and the first to sixth delay circuits 22-27.

Figure 5:
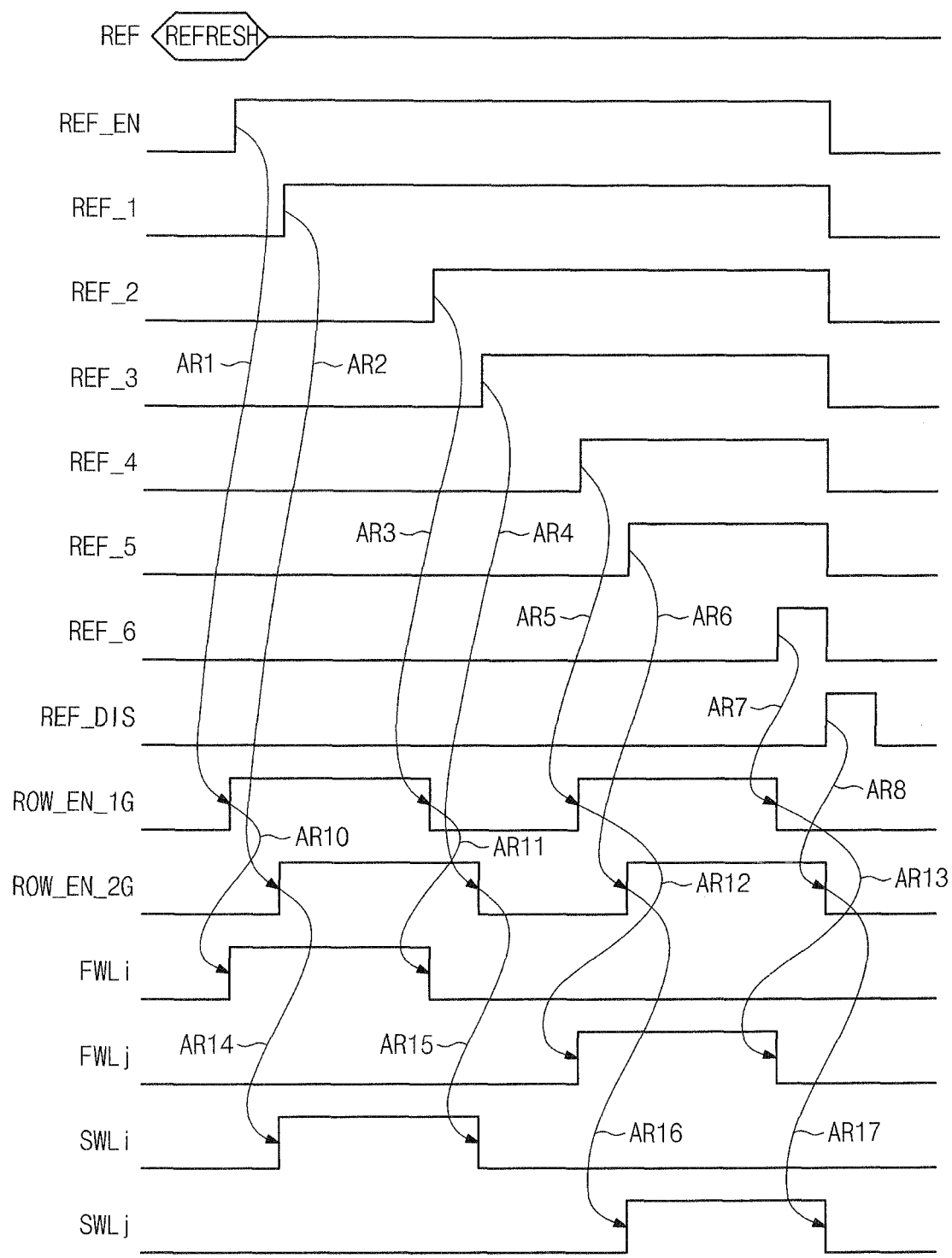
FIG. 5 is a timing diagram associated with the refresh circuit of FIG. 1.

Waveforms of the first to sixth refresh delay signals REF_1-REF_6 and the refresh disable signal REF_DIS may be waveforms REF_1-REF_6 and REF_DIS respectively shown in FIG. 5.

In FIG. 3, each of the delay circuits 22-27 includes an inverter delay including a plurality n of inverters I1-In (n preferably being a multiple of 2 and being greater than 4), an inverter INV1 for inverting the refresh disable signal REF_DIS, and an AND-gate AND1. The AND-gate AND1 receives the output of the inverter delay and the output of the inverter INV1 to generate an AND response. Thus, an input refresh delay signal REF_# (e.g., REF_1) is output to an output terminal of a delay circuit DC as a further delayed signal (e.g., REF_2).

Figure 4:
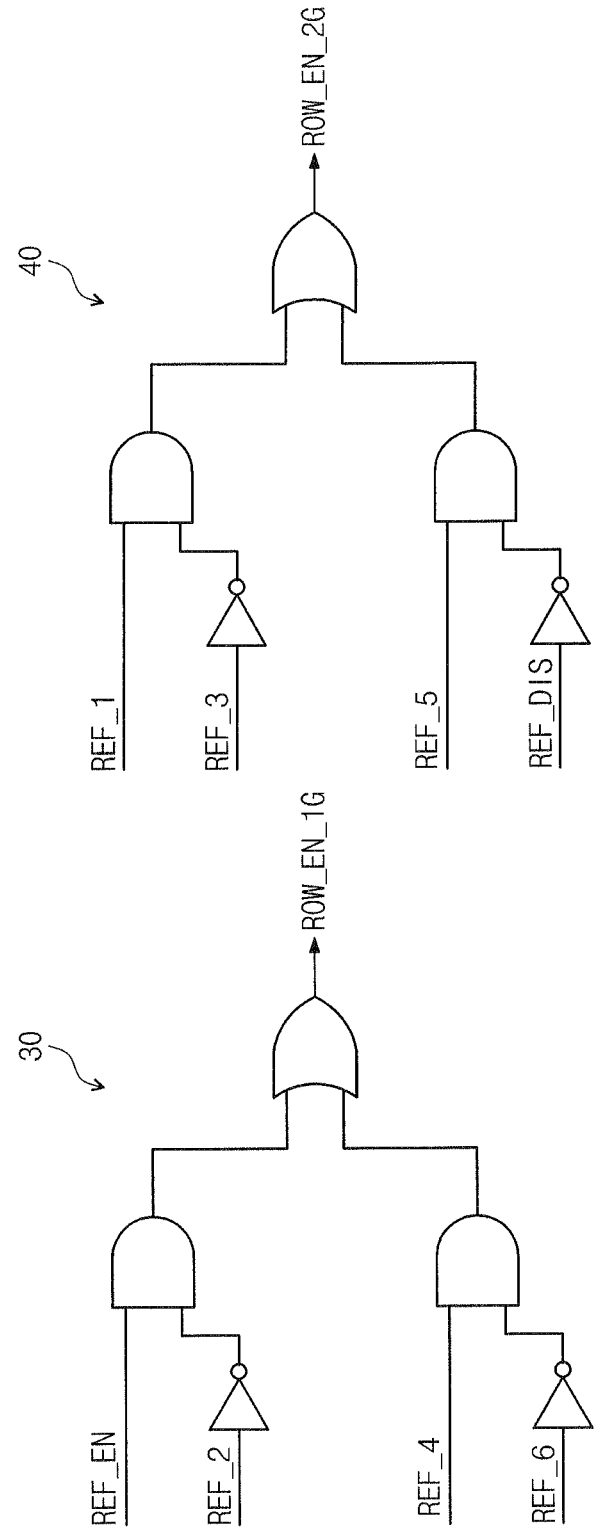
FIG. 4 is an detailed circuit diagram of first and second group row enable generators in the refresh circuit of FIG. 1.

FIG. 4 is detailed circuit diagram of the first and second group row enable generators 30 and 40 in the refresh circuit of FIG. 1. The first group row enable generator 30 includes two inverters, two AND-gates, and one OR-gate. Similarly, the second group row enable generator 40 includes two inverters, two AND-gates, and one OR-gate.

The first group row enable generator 30 receives the refresh enable signal REF_EN, the second refresh delay signal REF_2, the fourth refresh delay signal REF_4, and the sixth refresh delay signal REF_6 through the lines L10 in FIG. 1.

The first group row enable generator 30 performs inverting and gating to form a first group row enable signal ROW_EN_1G having the waveform shown in FIG. 5.

The second group row enable generator 40 receives the refresh disable signal REF_DIS, the first refresh delay signal REF_1, the third refresh delay signal REF_3, and the fifth refresh delay signal REF_5 through the lines L20 in FIG. 1.

The second group row enable generator 40 performs inverting and gating to form a second group row enable signal ROW_EN_2G having the waveform shown in FIG. 5.

FIG. 5 is a timing diagram associated with the refresh circuit of FIG. 1. FIG. 5 shows waveforms of the refresh command signal REF, the refresh enable signal REF_EN, the refresh disable signal REF_DIS, first to sixth refresh delay signals REF_1 through REF_6, and the first and second group row enable signals ROW_EN_1G and ROW_EN_2G.

In FIG. 5, wordline driving signals FWL(i) are generated (as indicated by arrows AR10 and AR11) during a first high-level period (Ta in FIG. 2) of the first group row enable signal ROW_EN_1G.

In FIG. 5, wordline driving signals FWL(j) are generated (as indicated by arrows AR12 and AR13) during a second high-level period (Tc in FIG. 2) of the first group row enable signal ROW_EN_1G.

FIG. 6 is a timing diagram that schematizes enabling of a normal wordline and a redundancy wordline (repaired) according to a refresh operation of the refresh circuit of FIG. 1.

FIG. 6 shows an example where in one memory block (or one memory bank), one wordline WL10 is replaced with a redundancy wordline RWL1 (e.g., due to failure of a memory cell on wordline WL10). In this case, if another normal wordline WL30 is refreshed together with the redundancy wordline RWL1, the normal wordline WL30 is not activated together with the redundancy wordline RWL1 due to input of a block signal Blocking applied as a high pulse during the period TA ("Ta" in FIG. 2) in a typical refresh operation period (corresponding to a high-level period of the waveform REF_EN in FIG. 2). However, since the normal wordline WL30 may be activated in an embodiment of the inventive concept, the normal wordline 30 may be enabled during one refresh operation.

The wordlines RWL1 and WL30 may belong to the same memory bank in a memory cell array. In this case, although the wordlines RWL1 and WL30 belong to the same memory bank, they may not belong to the same memory block.

In a memory controller according to an exemplary embodiment, a refresh command is applied with a period of 15.6 microseconds to a DRAM. Refresh time is determined according to the total number of rows and the number of refresh cycles of a DRAM. For example, in case of 4096 refresh cycle, refresh time is 15.6 microseconds×4096, i.e., 64 milliseconds. Since it is difficult to continue to increase refresh time as the memory capacity (megabytes) increases, a scheme of simultaneously activating a plurality of wordlines is used.

In this scheme, peak current increases as the memory capacity (megabytes) increases. But in an exemplary embodiment of the inventive concept, a refresh operation is internally performed at least N times (N being 2 or greater integer) when an external refresh command is generated once. During the refresh operation each time, a plurality of wordlines may be simultaneously activated. In conclusion, unlike a conventional refresh operation to simultaneously activate 20 different wordlines, the embodiment of the inventive concept is characterized in that a refresh operation is performed twice and 10 wordlines are simultaneously activated during each time during the refresh operation. Thus, peak current decreases by 1/N.

Furthermore, in case of a DRAM including a number of memory banks, peak current is distributed not by simultaneously refreshing the memory banks but by sequentially refreshing the memory banks with a predetermined delay time. Thus, the respective memory banks are refreshed with regular intervals. Power generation units connected to the memory banks also generate boosted voltages and a sense amplifier power. Thus, since the power generation units are driven with the same time differences, and increased peak current caused by sensing of memory cell data is not generated during a refresh operation.

Figure 7:
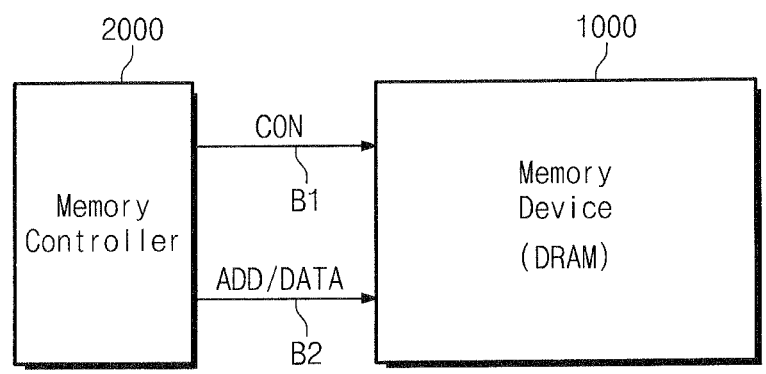
FIG. 7 is a block diagram illustrating an application example of the inventive concept applied to a memory system.

FIG. 7 is a block diagram illustrating an application example of the inventive concept applied to a memory system. As illustrated, the memory system includes a controller 1000 and a memory device 2000. The memory device 2000 may be a semiconductor memory device (e.g., DRAM) including a refresh circuit according to an embodiment of the inventive concept (e.g., as shown in FIG. 1). The controller 1000 may apply control signals CON to the memory device 2000 through a control bus B1. In addition, the controller 1000 may apply address signals ADD and data DATA to the memory device 2000 through an address/data bus B2.

The memory device 2000 decodes the control signals to perform a multi-enable skew refresh operation according to an embodiment of the inventive concept. Thus, peak current is minimized or reduced during a refresh operation of the memory device to 2000 enhance operation reliability of the memory system.

Figure 8:
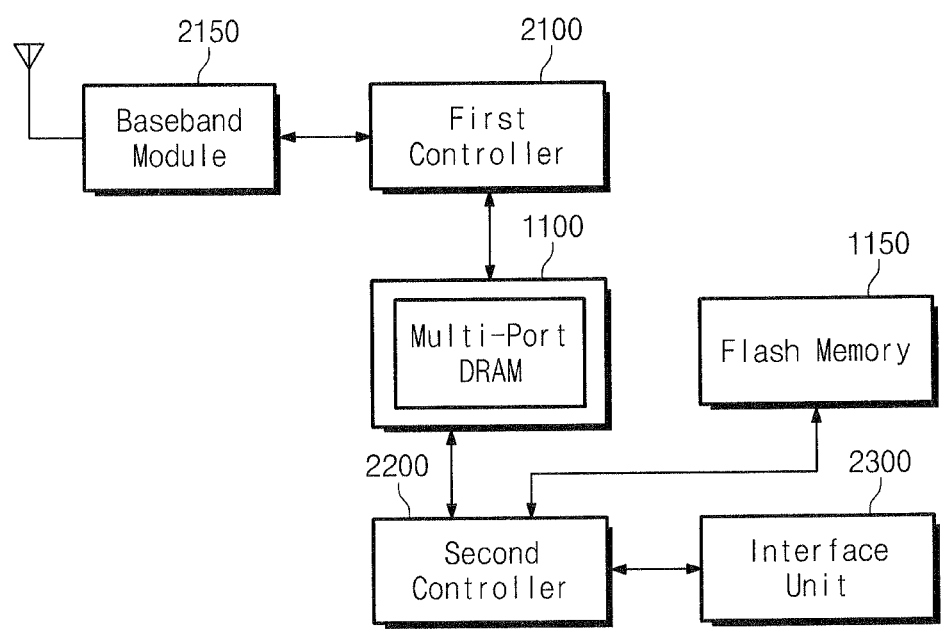
FIG. 8 is a block diagram illustrating an application example of the inventive concept embedded in an electronic device.

FIG. 8 is a block diagram illustrating an application example of the inventive concept embedded in an electronic device. As illustrated, the electronic device includes a baseband module 2150, a first controller 2100, a multi-port DRAM 1100, a flash memory 1150, a second controller 2200, and an interface unit 2300.

The multi-port DRAM 1100 and the flash memory 1150 may be fabricated as a multi-chip package. In addition, the first controller 2100, the multi-port DRAM 1100, and the flash memory 1150 may be fabricated as a single chip to be embedded in the electronic device.

If the electronic device is a portable communication device, the baseband module 2150 a modulation and demodulation function of communication data.

The first controller 2100 controls operations associated with sound and data communications according to a predetermined program.

The multi-port DRAM 1100 is commonly connected to the first and second controllers 2100 and 2200 through a system bus and functions as a main memory of the first and second controllers 2100 and 2200. When the multi-port DRAM 1100 is shareably accessed by the first and second controllers 2100 and 2200, the multi-port DRAM 1100 performs a multi-enable skew refresh operation according to an embodiment of the inventive concept. In this case, peak current is minimized or reduced in the refresh operation of the multi-port DRAM 1100 to enhance operation performance of the electronic device.

The flash memory 1150 may be a NOR-type or NAND-type flash memory.

The second controller 2200 controls the overall operation associated with an application according to a predetermined executable program.

The interface unit 2300 may be an input component including number keys and function keys and serves to interface between the electronic device and human.

While the electronic device has been described to focus on a mobile communication device, the electronic device may function as a smart card by adding or subtracting its components, if necessary.

The electronic device may connect a separate interface to an external communication device. The communication device may be a digital versatile disc (DVD) player, a computer, a set top box (STB), a game player, a digital camcorder or the like.

The electronic device may be further provided with a display unit which may include a liquid crystal having backlight, a liquid crystal having an LED light source or an organic light emitting diode (OLED). The display unit may function as an output component to display images such as letters, numbers, and figures in color.

Although not shown in the figure, it will be understood by those skilled in the art that the electronic device may be further provided with an application chipset, a camera image processor (CIS), a mobile DRAM, and so forth.

The multi-port DRAM chip or the flash memory chip may be packaged as one of various types to be subsequently embedded. For example, the chip may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Although FIG. 8 illustrates an example where a flash memory is employed in an electronic device, another nonvolatile storage medium may be employed.

The nonvolatile storage may store various types of data information such as texts, graphics, and executable software codes.

The nonvolatile storage may be implemented as, for example, an electrically erasable programmable read-only memory (EEPROM), a flash memory, a magnetic RAM (MRAM), a spin-transfer torque MRAM, a conductive bridging RAM (CBRAM), a ferroelectric RAM (FeRAM), a phase change RAM (PRAM) also referred to as an ovonic unified memory (OUM), a resistive RAM (RRAM or ReRAM), a nanotube RRAM, a polymer RAM (PoRAM), a nano floating gate Memory (NFGM), a holographic memory, a molecular electronics memory device) or an insulator resistance change memory.

By performing the method and the circuits described above, peak current can be minimized or reduced during a refresh operation to enhance performance of a semiconductor memory device.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A refresh circuit in a semiconductor memory device having a first memory group and a second memory group, comprising:
    a signal generation unit configured to receive a refresh command signal REF and to generate a plurality of refresh signals having different timings during a refresh operation period corresponding to the refresh command signal REF;
    a first refresh circuit configured to generate a first group row enable pulse based on a first subset of the plurality of refresh signals to enable first refresh target lines of the first memory group during a first enable time period and configured to generate a second group row enable pulse subsequent to the first group row enable pulse to enable second refresh target lines of the first memory group during a second enable time period, wherein the first and second enable time periods are within the refresh operation period; and
    a second refresh circuit configured to generate a third group row enable pulse based on a third subset of the plurality of refresh signals to enable third refresh target lines of the second memory group during a third enable time period and configured to generate a fourth group row enable pulse subsequent to the third group row enable pulse to enable fourth refresh target lines of the second memory group during a fourth enable time period, wherein the third and fourth enable time periods are within the refresh operation period,
    wherein first enable time period and the third enable time period are timewise-overlapping and do not begin at the same time.

2. The refresh circuit as set forth in claim 1, wherein the first memory group is a first memory bank unit and the second memory group is a second memory bank unit.

3. The refresh circuit as set forth in claim 1, wherein the first memory group is a first memory block unit and the second memory group is a second memory block unit.

4. The refresh circuit as set forth in claim 1, wherein the first refresh target lines and the second refresh target lines are wordlines having different row addresses.

5. The refresh circuit as set forth in claim 1, wherein a disable period for guaranteeing bitline precharge time exists between the first and second enable time periods.

6. The refresh circuit as set forth in claim 1, wherein the signal generation unit comprises:
    a command decoder configured to decode externally applied memory command signals to generate a refresh command signal REF; and
    a refresh signal generator configured to generate the first subset of the plurality of refresh signals and second subset of the plurality of refresh signals as the plurality of refresh signals by sequentially delaying a refresh enable signal REF_EN based on the refresh command signal REF and including a pulse having the width of the refresh operation period.

7. The refresh circuit as set forth in claim 6, wherein the first refresh circuit comprises:
    a first group row enable generator configured to generate a first group row enable signal comprising the first group row enable pulse and the second group row enable pulse by logically gating the first subset of the plurality of refresh signals;
    a refresh counter configured to perform counting in response to a transition of the first group row enable signal to output an internal refresh address;
    a multiplexer configured to output either one of the internal refresh address and an external refresh address according to the state of the first group row enable signal; and
    a first wordline driving signal generator configured to generate first wordline driving signals for enabling the first and second refresh target lines during the first and second enable time periods while the internal refresh address is output from the multiplexer.

8. The refresh circuit as set forth in claim 7, wherein the second refresh circuit comprises:
    a second group row enable generator configured to generate a second group row enable signal comprising first group row enable pulse and the second first group row enable pulse by logically gating the second subset of the plurality of refresh signals; and
    a second wordline driving signal generator configured to generate second wordline driving signals for enabling the second refresh target lines during the second enable time period while the internal refresh address is output from the multiplexer.

9. A refresh circuit in a semiconductor memory device having a first memory bank, comprising:
    a signal generation unit configured to generate a plurality of refresh signals having different timings during a refresh operation period;
    a first refresh circuit configured to enable a first wordline of a first memory block of the first memory bank during a first enable time period by using a first subset of the plurality of refresh signals, and configured to enable a second wordline of the first memory block of the first memory bank during a second enable time period by using a second subset of the plurality of refresh signals; and
    a second refresh circuit configured to enable a third wordline of a second memory block of the first memory bank during a third enable time period by using a third subset of the plurality of refresh signals, and configured to enable a fourth wordline of the second memory block of the first memory bank during a fourth enable time period by using a fourth subset of the plurality of refresh signals,
    wherein the first enable time period and the third enable time period are timewise-overlapping and have a skew with respect to each other.

10. The refresh circuit as set forth in claim 9, further comprising memory cell array including four or more memory banks.

11. The refresh circuit as set forth in claim 9, wherein the first and second wordlines of the first memory block are enabled at two different times during the refresh operation period.

12. The refresh circuit as set forth in claim 9, wherein a disable period for defining bitline precharge time between the first and second enable time periods.

13. The refresh circuit as set forth in claim 9, wherein the signal generator comprises:

a command decoder configured to decode externally applied memory command signals to generate a refresh command signal; and a refresh signal generator configured to generate first subset of the plurality of refresh signals and the second subset of the plurality of refresh signals having different timings by differently delaying a refresh enable signal REF_EN based on the refresh command signal REF and including a pulse having the width of the refresh operation period.

14. The refresh circuit as set forth in claim 9, wherein the first refresh circuit comprises:

a first group row enable generator configured to generate a first group row enable signal by logically gating the first subset of the plurality of refresh signals;

a refresh counter configured to perform counting in response to a transition of the first group row enable signal to output an internal refresh address;

a multiplexer configured to output either one of the internal refresh address and an external refresh address according to the state of the first group row enable signal; and a first wordline driving signal generator configured to generate first wordline driving signals for enabling the first and second wordlines of the first memory block during the first and second enable time periods while the internal refresh address is output from the multiplexer.

15. The refresh circuit as set forth in claim 14, wherein the second refresh circuit comprises:

a second group row enable generator configured to generate a second group row enable signal by logically gating the second subset of the plurality of refresh signals; and a second wordline driving signal generator configured to generate second wordline driving signals for enabling the third and fourth wordlines associated with the second memory block during the operation periods of the third and fourth enable time periods while the internal refresh address is output from the multiplexer.

16. A refresh circuit in a semiconductor memory device having a first memory group and a second memory group, comprising:

a first refresh circuit configured to generate a first group row enable pulse to enable a first wordline of the first memory group during a first enable time period and configured to generate a second group row enable pulse subsequent to the first group row enable pulse to enable a second wordline of the first memory group during a second enable time period, wherein the first and second enable time periods are within a refresh operation period; and a second refresh circuit configured to generate a third group row enable pulse to enable a third wordline of the second memory group during a third enable time period and configured generate a fourth group row enable pulse subsequent to the third group row ensble pulse to enable a fourth wordline of the second memory group during a fourt enable time period, wherein the third and fourth enable time periods are within the refresh operation period, wherein first enable time period and the third enable time period are timewise-overlapping and do not begin at the same time.

17. The refresh circuit as set forth in claim 16, further comprising:

a signal generation unit configured to generate a plurality of refresh signals during a refresh operation period corresponding to externally applied memory command signals; wherein the a first refresh circuit configured to generate the first group row enable pulse based on a first subset of the plurality of refresh signals and configured to generate the second group row enable pulse based on a second subset of the plurality of refresh signals; and the second refresh circuit is configured to generate the third group row enable pulse based on a third subset of the plurality of refresh signals and configured to generate the fourth group row enable pulse based on a fourth subset of the plurality of refresh signals.

18. The refresh circuit as set forth in claim 17, wherein the signal generation unit comprises:

a refresh signal generator comprising a plurality of cascade-connected delay circuits configured to sequentially delay a refresh enable signal REF_EN including a pulse having the width of the refresh operation period, to generate the plurality of refresh signals.

19. The refresh circuit as set forth in claim 18, wherein the first refresh circuit comprises:

a first group row enable generator configured to generate the first group row enable pulse by logically gating the first subset of the plurality of refresh signals.

20. The refresh circuit as set forth in claim 19, wherein the second refresh circuit comprises:

a second group row enable generator configured to generate the third group row enable pulse by logically gating the third subset of the plurality of refresh signals.

* * * * *